United States Patent [19]
Yu

[11] Patent Number: 6,140,948
[45] Date of Patent: Oct. 31, 2000

[54] ANALOG-TO-DIGITAL CONVERTER SYSTEM WITH AMPLIFIER GAIN CALIBRATION

[75] Inventor: Paul C. Yu, Dallas, Tex.

[73] Assignee: Texas Instruments Incorporated, Dallas, Tex.

[21] Appl. No.: 09/212,014

[22] Filed: Dec. 15, 1998

Related U.S. Application Data

[60] Provisional application No. 60/068,578, Dec. 23, 1997.

[51] Int. Cl.$^7$ .................................................. H03M 1/06
[52] U.S. Cl. ..................... 341/118; 341/120; 341/155; 341/172; 341/161
[58] Field of Search .................................. 341/118, 120, 341/155, 172, 161

[56] References Cited

U.S. PATENT DOCUMENTS

| | | | |
|---|---|---|---|
| 4,625,240 | 11/1986 | Yablonski | 348/484 |
| 4,774,497 | 9/1988 | Taylor | 341/118 |
| 4,999,625 | 3/1991 | Thompson | 341/118 |
| 5,028,924 | 7/1991 | Thompson | 341/118 |

*Primary Examiner*—Brian Young
*Assistant Examiner*—Jason L W Kost
*Attorney, Agent, or Firm*—W. Daniel Swayze, Jr.; W. James Brady, III; Frederick J. Telecky, Jr.

[57] ABSTRACT

An analog-to-digital converter system 10 is provided that comprises two separate banks of capacitors that are configured with a single operational amplifier 30 for each stage 29 within the system 10. The banks of capacitors are used in an interleaved fashion to simultaneously digitize analog input voltages and sample a reference voltage $V_{REF}$ to enable the digitization of a gain error associated with the operation of amplifier 30. This gain error can be combined with the raw digital output of the converter using an arithmetic logic unit 18 to result in a calibrated output for the system 10.

9 Claims, 2 Drawing Sheets

ANALOG-TO-DIGITAL CONVERTER SYSTEM WITH AMPLIFIER GAIN CALIBRATION

This application claims priority under 35 USC § 119(e)(1) of provisional application No. 60/068,578 filed Dec. 23, 1997.

TECHNICAL FIELD OF THE INVENTION

This invention relates in general to the field of electronic systems, and more particularly, to an improved analog-to-digital converter system that includes methods and systems for calibration due to amplifier gain error.

BACKGROUND OF THE INVENTION

Analog-to-digital converter systems receive analog signals and convert them to digital representations so that the signals can be processed in the digital domain. One popular architecture for analog-to-digital converter systems is an algorithmic analog-to-digital converter. Algorithmic analog-to-digital converters can be implemented using modern CMOS technology using switched capacitor techniques. In these architectures, capacitor banks are connected to an operational amplifier to form a converter stage. Each stage resolves a number of bits of the digital output word.

The theoretical operation of the analog-to-digital converter relies on the capacitors having the same capacitive value and the amplifier of each stage having an infinite open loop gain. Calibration techniques can be used to account for mismatch in the capacitor values Prior techniques to correct for the finite gain of the amplifier have serious drawbacks. First, many of the amplifier calibration techniques attempted to calibrate the finite gain of the amplifier at the same time they calibrated capacitor mismatch errors. These techniques proved to be very complex and accordingly, very time-consuming in terms of processing effort. Other techniques have necessitated the use of the entire analog-to-digital converter pipeline for calibration operations. These methods used the pipeline for calibration operation and thereby suspend the actual conversion process for some period of time. These techniques typically attempt to recover the loss time through the use of interpolation techniques. As such, the techniques are trading amplification error for interpolation error which may or may not be beneficial.

SUMMARY OF THE INVENTION

Accordingly, a need has arisen for an analog-to-digital converter system that allows for calibration of the system to eliminate errors due to finite gain of the amplifiers used within the converter stages and does so without satisfying converter throughput.

In accordance with the teachings of the present invention, an analog-to-digital converter architecture is provided that substantially reduces or eliminates disadvantages associated with prior systems and techniques. According to one embodiment of the present invention, a method of operating an analog-to-digital converter system is provided that comprises the steps of sampling a reference voltage using a first bank of capacitors and simultaneously sampling an input voltage to be converted using a second bank of capacitors. The method then uses the stored charge from the first bank of capacitors to generate, amplify, and communicate an error voltage to later stages within the analog-to-digital converter array. This error voltage can be digitized by a first array of capacitors in later stages in the converter system. The sampled input voltage is similarly processed and communicated to a second array of capacitors associated with later stages in the converter system so that the input voltage and the reference voltage are simultaneously digitized in the dual pipeline of the analog-to-digital converter system. The error voltage can then be used to calibrate the raw value of the digitized input voltage to reduce the error due to finite gain of the amplifiers within the system.

An important technical advantage of the converter system of the present invention inheres in the fact that it provides for an analog-to-digital converter system that includes two parallel and interrelated pipelines with independent arrays of capacitors. This allows for a calibration voltage and an actual input voltage to simultaneously flow through the converter system. This allows for real time calibration to occur without sacrificing throughput of the actual conversion of the input voltage.

BRIEF DESCRIPTION OF THE DRAWINGS

A more complete understanding of the teachings of the present invention and the advantages thereof can be acquired by referring to the accompanying figures in which like reference numbers indicate like features and wherein.

DETAILED DESCRIPTION OF THE INVENTION

Figure 1:
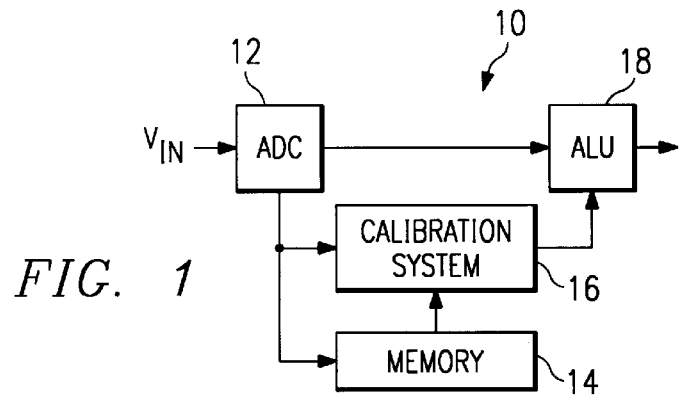
FIG. 1 is a block diagram of an analog-to-digital converter system having calibration capabilities constructed according to the teachings of the present invention.

FIG. 1 is a block diagram of an analog-to-digital converter system, indicated generally at 10, that comprises a multi-stage analog-to-digital converter 12 that receives an analog input voltage $V_{IN}$. The operation of analog-to-digital converter system 12 will be discussed more completely with reference to later FIGURES. However, in general, analog-to-digital converter system 12 comprises an algorithmic analog-to-digital converter that comprises a serial connection of converter stages. Each of the converter stages is operable to generate one or more bits of a digital word that represents the instantaneous value of the analog voltage $V_{IN}$. The digital outputs of the converter stages are supplied to a memory system 14. The outputs are also supplied to a calibration system 16. Finally, the digital outputs are available to an arithmetic logic unit 18. The arithmetic logic unit 18 is operable to receive the raw digital representation of the input voltage from the converter system 12 and the error correction values from the calibration system 16. Arithmetic logic unit 18 is operable to combine the values received from systems 12 and 16 to generate a calibrated output which reduces or eliminates errors associated with the operation of the analog-to-digital converter system 12.

As is fully described in Applicant's copending application entitled "Analog To Digital Converter System Having Enhanced Digital Self-Calibration", Ser. No. 09/211,906, assigned to the assignee of the present application, the disclosure of which is hereby incorporated by reference, the calibration system 16 is operable to perform multi-order calibration to generate extremely accurate error correction values to correct for offset voltages and capacitor mismatches within the stages of the analog-to-digital converter system 12.

Each of the stages of the analog-to-digital converter system 12 also comprises a high gain operational amplifier. If the gain of the amplifier within each stage of system 12 could be reduced, the overall power consumption of system 10 could be reduced and the overall speed of system 10 could increase. However, reducing the gain of the amplifiers within the stages of system 12 can introduce significant error to the system. However, as will be discussed herein, the calibration system 16 and the analog-to-digital converter system 12 are constructed according to teachings of the present invention to provide for simultaneous parallel calibration of the overall system 10 to eliminate or reduce errors associated with the finite gain of the operational amplifiers. As such, without any reduction in the throughput of the system 10, these errors can be accounted for and the overall accuracy of system 10 will not suffer.

Figure 2A:
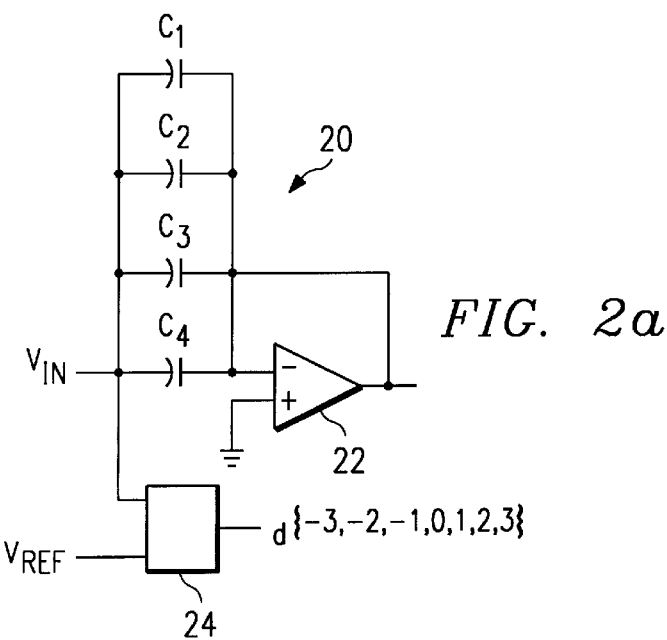
FIGS. 2A and 2B are schematic diagrams of an analog-to-digital converter stage constructed according to the teachings of the present invention.

FIG. 2A illustrates the construction of a single stage 20 within analog-to-digital converter system 12. All stages within the system are substantially identical. Stage 20 comprises an operational amplifier 22 which has its positive input connected to ground potential. The inverting input of amplifier 22 is connected to the top plates of four capacitors connected in parallel, C1, C2, C3 and C4. The bottom plates of capacitors C1, C2, C3 and C4 are connected to the input voltage $V_{IN}$. The input voltage $V_{IN}$ is also connected to one input of a comparator system 24. The remaining input of comparator system 24 is connected to a reference voltage $V_{REF}$. Comparator system 24 comprises a number of comparator subsystems which each compare the input voltage to various fractions of the referenced voltage to determine in what range an instantaneous value of the input voltage $V_{IN}$ resides. As a result of these comparisons, the comparator system 24 outputs a single digital value which can range from −3 to +3. As such, the architecture shown in FIG. 2 allows for the output of three bits per stage.

FIG. 2A illustrates the stage 20 in a sampling configuration. In operation, each stage is first used to sample an input voltage and to generate a comparator output. The same stage is then used to generate a residual voltage and amplify that residual voltage before it is passed on to the next stage for further resolution of additional bits within the digital word that eventually represents the input voltage. In this way, the pipeline of multiple stages within the converter system 12 successively generates more and more bits of the digital word representing the input voltage $V_{IN}$ as each stage samples the input voltage from the preceding stage, generates a residual voltage, and passes the amplified residual voltage on to the next stage.

Figure 2B:
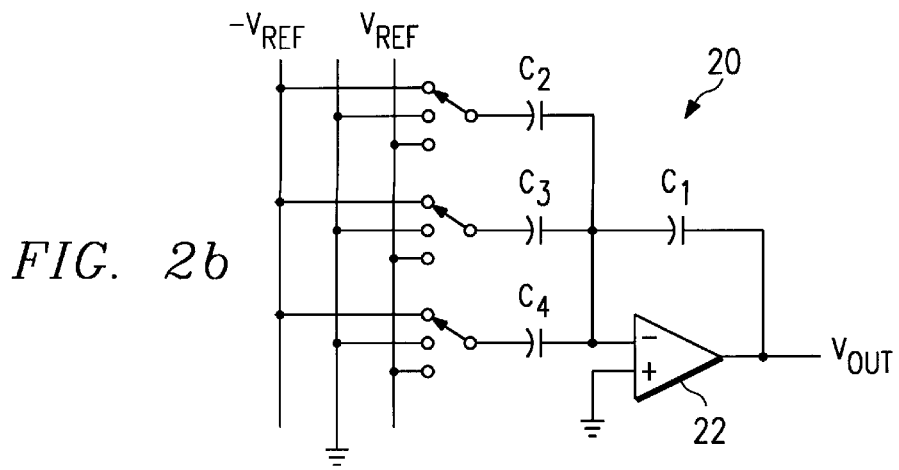

FIG. 2B illustrates the components of stage 20 in an amplification phase where they will pass on an amplified residual voltage to the next stage in the converter system. The bottom plate of capacitor C1 is connected to the output of amplifier 22. The bottom plates of capacitors of C2, C3, and C4 are connected to either ground potential, the reference voltage $V_{REF}$ or the inverse of the reference voltage minus $V_{REF}$. These connections are made depending upon the value of the output of comparator 24. The range of the input voltage, the resulting residual output from comparator system 24 and the resulting output voltage of the stage 20 are given in the following Table 1.

TABLE 1

| $V_{IN}$ | digital decision $V_o$ | |
|---|---|---|
| $-V_{REF} \le V_{IN} < -\left(\frac{5}{8}\right)V_{REF}$ | −3 | $\left(\frac{C1+C2+C3+C4}{C1}\right) \cdot V_{IN} + \left(\frac{C2+C3+C4}{C1}\right) \cdot V_{REF}$ |
| $\left(\frac{5}{8}\right)V_{REF} \le V_{IN} < -\left(\frac{3}{8}\right)V_{REF}$ | −2 | $\left(\frac{C1+C2+C3+C4}{C1}\right) \cdot V_{IN} + \left(\frac{C2+C3}{C1}\right) \cdot V_{REF}$ |
| $\left(\frac{3}{8}\right)V_{REF} \le V_{IN} < -\left(\frac{1}{8}\right)V_{REF}$ | −1 | $\frac{C1+C2+C3+C4}{C1} \cdot V_{IN} + \left(\frac{C2}{C1}\right) \cdot V_{REF}$ |
| $\left(\frac{1}{8}\right)V_{REF} \le V_{IN} < -\left(\frac{1}{8}\right)V_{REF}$ | 0 | $\left(\frac{C1+C2+C3+C4}{C1}\right) \cdot V_{IN}$ |
| $\left(\frac{1}{8}\right)V_{REF} \le V_{IN} < -\left(\frac{3}{8}\right)V_{REF}$ | 1 | $\frac{C1+C2+C3+C4}{C1} \cdot V_{IN} - \left(\frac{C2}{C1}\right) \cdot V_{REF}$ |
| $\left(\frac{3}{8}\right)V_{REF} \le V_{IN} < -\left(\frac{5}{8}\right)V_{REF}$ | 2 | $\frac{C1+C2+C3+C4}{C1} \cdot V_{IN} - \left(\frac{C2+C3}{C1}\right) \cdot V_{REF}$ |
| $\left(\frac{5}{8}\right)V_{REF} \le V_{IN} < V_{REF}$ | 3 | $\left(\frac{C1+C2+C3+C4}{C1}\right) \cdot V_{IN} - \left(\frac{C2+C3+C4}{C1}\right) \cdot V_{REF}$ |

From Table 1, it can be seen that the residual output from each stage can be concisely expressed as:

$$V_O = \begin{cases} \left(\dfrac{\sum_{i=1}^{4} Ci}{C1}\right) \cdot VIN + \left(\dfrac{\sum_{+i=+2}^{-d+1} Ci}{C1}\right) VREF, \text{ if } d < 0 \\ \left(\dfrac{\sum_{i=1}^{4} Ci}{C1}\right) \cdot VIN, \text{ if } d = 0 \\ \left(\dfrac{\sum_{i=1}^{4} Ci}{C1}\right) \cdot VIN - \left(\dfrac{\sum_{i=2}^{d+1} Ci}{C1}\right) VREF, \text{ if } d > 0 \end{cases}$$

The error due to the operation of amplifier 22 can be measured by sampling the reference voltage $V_{REF}$ and digitizing the resulting value using successive stages in the converter system 22. Once the digital value of this error voltage $D(V_{ERR})$ is computed, this digital value can be subtracted from the raw digital output of the converter system 12 by the ALU 18 to obtain the calibrated digital output. In order to obtain the error voltage $V_{ERR}$, the first stage of the converter system 12 is used to sample reference voltage by connecting the bottom plates of capacitors C1 through C4 to $V_{REF}$ while the amplifier 22 is in a unity gain configuration. During the amplification phase, the bottom plates of C2 through C4 remain connected to $V_{REF}$, while the bottom plate of C1 is connected to the output of amplifier 22. If a zero amplifier offset is assumed, it can be shown that the output voltage $V_{OUT}$ of amplifier 22 is given by $$VO = \left(\frac{C1+C2+C3+C4}{C1}\right)\left(\frac{1}{1+af}\right)VREF -$$
$$\left(\frac{C2+C3+C4}{C1}\right)\left(\frac{1}{1+af}\right)VREF$$
$$= \left(\frac{1}{1+af}\right)VREF$$
$$\cong \left(1 - \frac{1}{af}\right)VREF$$

where $f$ is a feedback factor equal to C1 divided by (C1+C2+C3+C4).

Observe that the op-amp gain error 1/af is contained in the prior equation. The digitized value of 1/af can be obtained by first digitizing $V_{OUT}$ using the successive stages of the converter system 12 and then subtracting the digitized value of $V_{REF}$. Since the digital value of $V_{REF}$ is equal to 1 by definition, the digitized value for 1 divided by af can easily be obtained. Once the digitized value of 1/af is obtained, the calibration quantity $D(-V_{ERR})$ is given by:

$$D(-V_{err}) = 4/af\, D(V_{IN}) - d/af$$

where D(VIN)=[D(i)/4+D(i+1)/16+D(i+1)/64+ . . . ], and d=[−3,3] or [−3,4] depending on the actual implementation of the digital error correction.

These computations require conventional digital addition and digital multiplication which can be accomplished by arithmetic logic unit 18 described previously. An important advantage of the present invention is that the output voltage given by the prior equations is independent of the capacitor mismatch. This allows the op-amp gain error to be measured independently from the capacitor calibration described in the copending application "Analog-to-Digital Converter System Having Enhanced Digital Self Calibration" incorporated by reference previously. This fact is particularly important because operational amplifiers, being made of active devices, which are more temperature sensitive compared to capacitors, require more frequent calibration. Prior calibration techniques require a great deal of time to calibrate all of the capacitors within a particular stage. During this time an operational amplifier can drift due to changes in temperature and other ambient conditions to the point that the calibration data is no longer valid. In contrast, the technique of the present invention requires as little as one clock cycle and is completely independent of the number of bits per stage. Accordingly, the techniques of the present invention are fast enough that they can be performed continuously and, as such, the calibration will track whatever changes occur in ambient conditions.

The technique previously described assumed a zero offset of the amplifier 22. In the case of a non-zero offset, the method of the present invention remains valid with one small addition. If the offset is attributable to the amplifier 22 is negative, the technique previously described is still effective. However, if the offset is positive, the positive end of the conversion range near the full value of $V_{REF}$ is clipped and the circuit described previously is no longer effective. Instead, the compliment of the reference voltage $V_{REF}$ is sampled. Selection of which polarity is used to accomplish by measuring the input referred offset with a zero input applied to the converter stage to be calibrated. The polarity of the offsets selects the appropriate configuration.

Prior calibration techniques required that the converter system be interrupted for calibration. According to the teachings of the present invention, calibration can be done continuously without interrupting the converter. This capability allows the calibration to track the temperature drift to the op-amp and allows for a full Nyquist rate conversion to be achieved without complex digital interpolation circuitry. A circuit constructed in order to accomplish this is shown in FIG. 3.

Figure 3A:
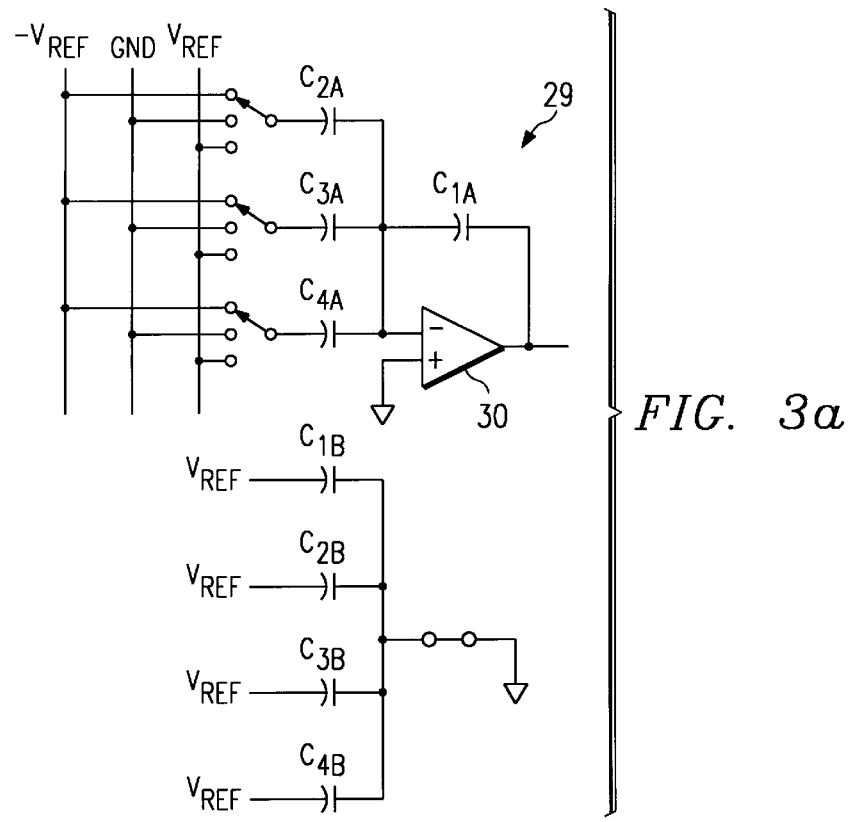
FIGS. 3A and 3B are schematic diagrams of an analog-to-digital converter stage constructed according to the teachings of the present invention.
Figure 3B:
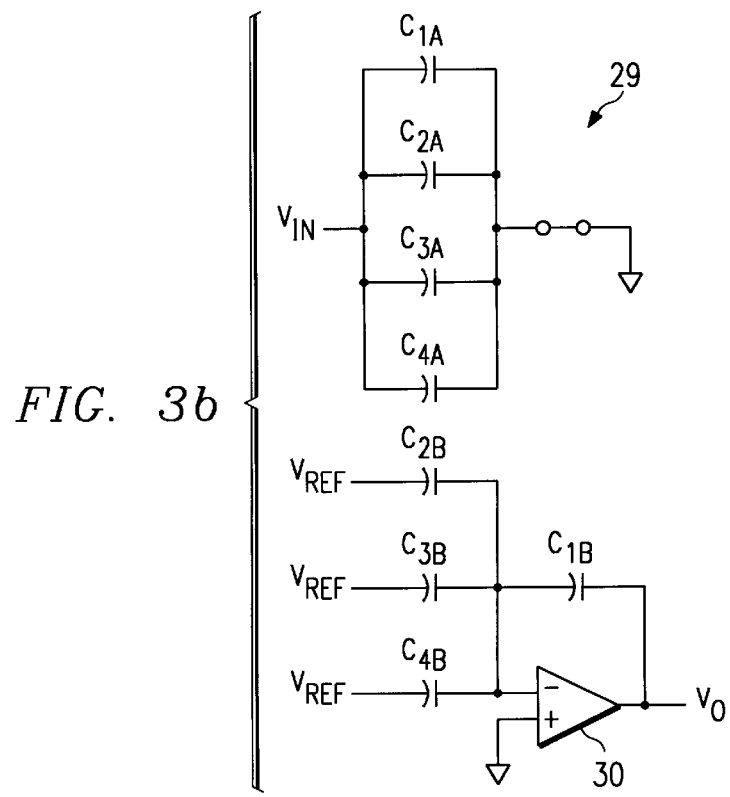

Referring to FIG. 3, a single stage indicated generally at 29 of an analog-to-digital converter constructed according to the teachings of the present invention is shown in two different configurations. Both configurations use a single amplifier 30. The single stage includes two banks of capacitors, an A bank and a B bank. Each bank contains four capacitors. In the first phase of operation, the B bank capacitors, C1B through C4B, sample the reference voltage $V_{REF}$ by connecting the bottom plates to $V_{REF}$ and the top plates to ground potential. In the second phase of operation, the B bank of capacitors, C1B through C4B, are connected with the top plates connected to the inverting input of amplifier 30. The bottom plates of capacitors C2B through C4B continue to be connected to the reference voltage $V_{REF}$. The bottom plate of capacitor C1B is connected to the output of amplifier 30. The noninverting input of amplifier 30 is connected to ground potential. Using operations described previously, therefore, the B bank capacitors C1B through C4B are used to characterize the op-amp gain error and communicate the residual of that gain error to the remaining stages downstream from stage 29 for digitization. Once the op-amp gain error is digitized, the calibration correction described previously can be performed. As can be seen, the amplifier 30 is only needed in one of the phases of operation. As such, the amplifier 30 during the other phase of the operation can be connected to the remaining bank of capacitors. As shown in FIG. 3, in the first phase of operation, the A bank of capacitors C1A through C4A are connected in the amplification mode. The top plates of capacitors C1A through C4A are connected to the inverting input of amplifier 30. The bottom plate of capacitors C2A through C4A are connected as described with reference to Table 1 previously. The bottom plate of capacitor C1A is connected to the output of amplifier 30. In the second phase of operation, the capacitor C1A through C4A are connected with their bottom plates connected to the input voltage $V_{IN}$ and their top plates connected to ground potential. In this manner, the parallel operation of the two banks of capacitors with a single amplifier 30 can be used to simultaneously sample an actual input voltage and then in the next phase of operation, communicate the residual voltage associated with that voltage to remaining stages within the array. This operation occurs simultaneously with the sampling of a reference voltage to enable the digitization of a calibration quantity associated with operation amplifier gain error. In this manner, the calibration and the actual conversion are interleaved while Nyquist conversion rate is maintained.

Although the present invention has been described in detail, it should be understood that various changes, substitutions, and modifications can be made to the teachings described herein without departing from the spirit and scope of the present invention which is solely defined by the appended claims.

What is claimed is:

1. An analog-to-digital converter system comprising a serial connection of successive converter stages, each converter stage operable to generate at least one digital bit of a digital word representing an analog signal being converted by the converter system, each converter stage comprising:

an operational amplifier;

a first bank of capacitors operable to sample an input voltage associated with the analog signal being converted by the converter system, the first bank of capacitors also configurable with the operational amplifier to generate, amplify and communicate a raw residual voltage to a first bank of capacitors in a successive converter stage;

a second bank of capacitors operable to sample a reference voltage and configurable with the operational amplifier to generate, amplify and communicate an error residual voltage to a second bank of capacitors in the successive converter stage; and a comparator system operable to test the input voltage and the reference voltage and to generate at least one digital bit of a raw digital output word associated with the input voltage and an digital error value associated with the reference voltage, the digital error value indicative of error introduced into the operation of the converter system by imperfections in the operational amplifiers of each stage of the converter system.

2. The analog-to-digital converter system of claim 1 and further comprising a calibration system operable to subtract the digital error value from the raw digital output word to generate a calibrated digital output associated with the analog signal being converted by the converter system and wherein the error associated with imperfections in the operational amplifiers of each stage of the converter system is reduced.

3. The analog-to-digital converter system of claim 1 wherein the converter stages are operable to generate at least one bit of the raw digital output word and at least one bit of the digital error value in interleaved cycles of operation of the stage.

4. The analog-to-digital converter system of claim 1 wherein at least some of the converter stages are operable to generate more than one bit of the raw digital output word and the digital error value in interleaved cycles of operation of the stage.

5. The analog-to-digital converter system of claim 1 wherein the reference voltage comprises ground potential.

6. A method of operating an analog-to-digital converter system comprising the steps of:

sampling a reference voltage using a first bank of capacitors;

sampling an input voltage to be converted using a second bank of capacitors;

generating, amplifying and communicating to successive converter stages an error residual voltage using the stored charge from the first bank of capacitors, the error residual voltage being a function of error introduced by imperfections in the operation of operational amplifiers in each stage of the converter system;

digitizing the residual error voltage to generate a digital error value;

generating, amplifying and communicating to successive converter stages a raw residual voltage using the stored charge from the second bank of capacitors;

digitizing the raw residual voltage to generate a raw digital value; and subtracting the digital error value from the raw digital value to generate a calibrated digital output such that the error due to imperfections in the operational amplifiers is reduced, the digitization of the error voltage and the input voltage occurring in parallel through the successive stages of the converter system.

7. The method of claim 6 wherein the converter stages are operable to generate at least one bit of the raw digital output word and at least one bit of the digital error value in interleaved cycles of operation of the stage.

8. The method of claim 6 wherein at least some of the converter stages are operable to generate more than one bit of the raw digital output word and the digital error value in interleaved cycles of operation of the stage.

9. The method of claim 6 wherein the reference voltage comprises ground potential.

* * * * *